(12) United States Patent
Wu et al.

(10) Patent No.: US 8,664,695 B2
(45) Date of Patent: Mar. 4, 2014

(54) WIDE BANDGAP TRANSISTORS WITH MULTIPLE FIELD PLATES

(75) Inventors: Yifeng Wu, Goleta, CA (US); Primit Parikh, Goleta, CA (US); Umesh Mishra, Montecito, CA (US); Marcia Moore, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 19 days.

(21) Appl. No.: 12/497,468

(22) Filed: Jul. 2, 2009

(65) Prior Publication Data

US 2009/0267116 A1    Oct. 29, 2009

Related U.S. Application Data

(62) Division of application No. 10/976,422, filed on Oct. 29, 2004, now Pat. No. 7,573,078.

(60) Provisional application No. 60/570,518, filed on May 11, 2004.

(51) Int. Cl.
*H01L 29/778* (2006.01)

(52) U.S. Cl.
USPC ....... 257/194; 257/409; 257/E29.46; 438/140

(58) Field of Classification Search
USPC ........... 257/194, 409, E29.246; 438/140, 454
See application file for complete search history.

(56) References Cited

U.S. PATENT DOCUMENTS

| | | | |
|---|---|---|---|
| 4,290,077 A | 9/1981 | Ronen | 257/409 |
| 4,551,905 A | 11/1985 | Chao et al. | 438/570 |
| 4,766,474 A | 8/1988 | Nakagawa et al. | |
| 4,947,232 A | 8/1990 | Ashida et al. | 357/53 |
| 5,053,348 A | 10/1991 | Mishra et al. | 438/571 |
| 5,187,552 A | 2/1993 | Hendrickson et al. | 257/408 |
| 5,192,987 A | 3/1993 | Khan et al. | 257/183.1 |
| 5,196,359 A | 3/1993 | Shih et al. | 437/40 |
| 5,290,393 A | 3/1994 | Nakamura | 257/488 |

(Continued)

FOREIGN PATENT DOCUMENTS

| CN | 1428870 A | 7/2003 |
|---|---|---|
| CN | 1639875 A | 7/2005 |

(Continued)

OTHER PUBLICATIONS

Xing et al., "High Breakdown Voltage AlGaN-GaN HEMTs Achieved by Multiple Field Plates," Apr. 2004, IEEE Electron Device Letters, vol. 25, No. 4, pp. 161-163.*

(Continued)

*Primary Examiner* — Allan R Wilson
(74) *Attorney, Agent, or Firm* — Koppel, Patrick, Heybl & Philpott

(57) ABSTRACT

A transistor comprising a plurality of active semiconductor layers on a substrate, with source and drain electrodes in contact with the semiconductor layers. A gate is formed between the source and drain electrodes and on the plurality of semiconductor layers. A plurality of field plates are arranged over the semiconductor layers, each of which extends from the edge of the gate toward the drain electrode, and each of which is isolated from said semiconductor layers and from the others of the field plates. The topmost of the field plates is electrically connected to the source electrode and the others of the field plates are electrically connected to the gate or the source electrode.

38 Claims, 4 Drawing Sheets

(56) References Cited

U.S. PATENT DOCUMENTS

| | | | |
|---|---|---|---|
| 5,399,886 A | 3/1995 | Hasegawa | 257/192 |
| 5,470,767 A | 11/1995 | Nakamoto et al. | 438/570 |
| 5,569,937 A | 10/1996 | Bhatnagar | 257/77 |
| 5,652,179 A | 7/1997 | Strifler et al. | 438/578 |
| 5,701,019 A | 12/1997 | Matsumoto et al. | 257/192 |
| 5,710,455 A * | 1/1998 | Bhatnagar et al. | 257/472 |
| 5,780,900 A | 7/1998 | Suzuki et al. | 257/335 |
| 5,885,860 A | 3/1999 | Weitzel et al. | 257/347 |
| 5,929,467 A | 7/1999 | Kawai et al. | 257/192 |
| 5,959,307 A | 9/1999 | Nakamura et al. | 257/14 |
| 6,033,948 A | 3/2000 | Kwon et al. | |
| 6,057,564 A | 5/2000 | Rennie | 257/99 |
| 6,100,571 A | 8/2000 | Mizuta et al. | |
| 6,127,703 A | 10/2000 | Letvic et al. | 257/347 |
| 6,140,169 A | 10/2000 | Kawai et al. | 438/197 |
| 6,242,766 B1 | 6/2001 | Tateno | 257/194 |
| 6,307,232 B1 | 10/2001 | Akiyama et al. | 257/347 |
| 6,346,451 B1 | 2/2002 | Simpson et al. | |
| 6,445,038 B1 | 9/2002 | Tihanyi | 257/347 |
| 6,468,878 B1 | 10/2002 | Petruzzello et al. | 438/454 |
| 6,475,857 B1 | 11/2002 | Kim et al. | 438/240 |
| 6,483,135 B1 | 11/2002 | Mizuta et al. | 257/285 |
| 6,495,409 B1 | 12/2002 | Manfra et al. | 438/216 |
| 6,559,513 B1 | 5/2003 | Miller et al. | 257/488 |
| 6,586,781 B2 | 7/2003 | Wu et al. | 257/194 |
| 6,586,813 B2 | 7/2003 | Nagahara | |
| 6,620,688 B2 | 9/2003 | Woo et al. | 438/262 |
| 6,621,121 B2 | 9/2003 | Baliga | 257/330 |
| 6,624,488 B1 | 9/2003 | Kim | 257/411 |
| 6,627,473 B1 | 9/2003 | Oikawa et al. | 438/46 |
| 6,686,616 B1 | 2/2004 | Allen et al. | 257/280 |
| 6,690,042 B2 | 2/2004 | Khan et al. | 257/192 |
| 6,740,535 B2 | 5/2004 | Singh et al. | 438/18 |
| 6,838,325 B2 | 1/2005 | Whelan et al. | 438/172 |
| 6,891,235 B1 | 5/2005 | Furukawa et al. | 257/480 |
| 6,933,544 B2 | 8/2005 | Saito et al. | 257/194 |
| 6,940,090 B2 | 9/2005 | Saito et al. | 257/20 |
| 6,972,440 B2 | 12/2005 | Singh et al. | 257/194 |
| 7,012,286 B2 | 3/2006 | Inai et al. | 257/192 |
| 7,038,252 B2 | 5/2006 | Saito et al. | 257/192 |
| 7,071,498 B2 | 7/2006 | Johnson et al. | 257/192 |
| 7,126,426 B2 | 10/2006 | Mishra et al. | 330/307 |
| 7,229,903 B2 | 6/2007 | Li et al. | 438/571 |
| 7,282,423 B2 | 10/2007 | Furukawa et al. | 436/422 |
| 7,465,967 B2 | 12/2008 | Smith et al. | 257/194 |
| 7,501,669 B2 * | 3/2009 | Parikh et al. | 257/194 |
| 7,508,015 B2 | 3/2009 | Saito et al. | 257/192 |
| 7,550,783 B2 | 6/2009 | Wu et al. | 257/194 |
| 7,800,131 B2 | 9/2010 | Miyamoto et al. | 257/192 |
| 7,812,369 B2 * | 10/2010 | Chini et al. | 257/192 |
| 7,863,648 B2 | 1/2011 | Miyamoto et al. | 257/192 |
| 8,120,066 B2 | 2/2012 | Lanzieri et al. | 257/194 |
| 2001/0015446 A1 | 8/2001 | Inoue et al. | |
| 2001/0023964 A1 | 9/2001 | Wu et al. | |
| 2002/0005528 A1 | 1/2002 | Nagahara | |
| 2002/0017648 A1 | 2/2002 | Kasahara et al. | |
| 2002/0105028 A1 | 8/2002 | Fujihira | 257/339 |
| 2002/0137318 A1 | 9/2002 | Peake et al. | |
| 2002/0139995 A1 | 10/2002 | Inoue et al. | 257/194 |
| 2002/0155646 A1 | 10/2002 | Petruzzello et al. | |
| 2003/0006437 A1 | 1/2003 | Mizuta et al. | |
| 2003/0075719 A1 * | 4/2003 | Sriram | 257/77 |
| 2003/0107081 A1 | 6/2003 | Lee et al. | |
| 2003/0132463 A1 | 7/2003 | Miyoshi | |
| 2003/0183844 A1 | 10/2003 | Yokoyama et al. | |
| 2003/0183886 A1 | 10/2003 | Inoue et al. | |
| 2003/0222327 A1 | 12/2003 | Yamaguchi et al. | |
| 2004/0021152 A1 | 2/2004 | Nguyen et al. | 257/192 |
| 2004/0029330 A1 | 2/2004 | Hussain et al. | 438/172 |
| 2004/0124435 A1 | 7/2004 | D'Evelyn et al. | 257/103 |
| 2004/0188775 A1 | 9/2004 | Peake et al. | 257/397 |
| 2004/0227211 A1 | 11/2004 | Saito et al. | |
| 2005/0051796 A1 | 3/2005 | Parikh et al. | 257/192 |
| 2005/0051800 A1 | 3/2005 | Mishra et al. | 257/202 |
| 2005/0062069 A1 | 3/2005 | Saito et al. | 257/347 |
| 2005/0082611 A1 | 4/2005 | Peake et al. | 257/341 |
| 2005/0110042 A1 | 5/2005 | Saito et al. | |
| 2005/0124100 A1 | 6/2005 | Robinson | 438/167 |
| 2005/0133818 A1 | 6/2005 | Johnson et al. | 257/192 |
| 2005/0208722 A1 | 9/2005 | Peake et al. | 438/259 |
| 2005/0253168 A1 | 11/2005 | Wu et al. | 257/192 |
| 2006/0006415 A1 | 1/2006 | Wu et al. | 257/194 |
| 2006/0011915 A1 | 1/2006 | Saito et al. | 257/65 |
| 2006/0043416 A1 | 3/2006 | Li et al. | 257/192 |
| 2006/0071247 A1 | 4/2006 | Chen et al. | |
| 2006/0081877 A1 | 4/2006 | Kohji et al. | 257/194 |
| 2006/0202272 A1 | 9/2006 | Wu et al. | 257/355 |
| 2012/0132959 A1* | 5/2012 | Parikh et al. | 257/194 |

FOREIGN PATENT DOCUMENTS

| | | |
|---|---|---|
| EP | 0069429 A | 12/1983 |
| EP | 0792028 A2 | 2/1997 |
| EP | 0792028 | 8/1997 |
| EP | 1336989 | 8/2003 |
| JP | 62/237763 | 10/1987 |
| JP | 05021793 A | 1/1993 |
| JP | 06-349859 | 12/1994 |
| JP | 6349859 A | 12/1994 |
| JP | 07050413 | 2/1995 |
| JP | 07176544 | 7/1995 |
| JP | 09232827 | 5/1997 |
| JP | 11274174 A | 8/1999 |
| JP | 1197455 | 9/1999 |
| JP | 11-274174 | 10/1999 |
| JP | 11274174 | 10/1999 |
| JP | 2000-003919 | 1/2000 |
| JP | 2000-100831 | 4/2000 |
| JP | 2000100831 A | 4/2000 |
| JP | 2000-164926 | 6/2000 |
| JP | 2002-270830 | 3/2001 |
| JP | 2002-016245 | 1/2002 |
| JP | 2002270830 A | 9/2002 |
| JP | 2003203923 | 7/2003 |
| JP | 2003297854 | 10/2003 |
| JP | 2005527102 A | 9/2005 |
| JP | 2007019560 | 1/2007 |
| TW | 334632 B | 6/1998 |
| TW | 552712 B | 11/2003 |
| TW | 579600 B | 3/2004 |
| TW | 122230978 B | 4/2005 |
| WO | WO 9908323 | 2/1999 |
| WO | WO 03036729 A1 | 1/2003 |
| WO | WO 2003/032397 A2 | 4/2003 |
| WO | WO 2003/036729 | 5/2003 |
| WO | WO 03038905 A2 | 8/2003 |
| WO | WO 2004068590 A1 | 8/2004 |
| WO | WO 2006025971 | 7/2005 |
| WO | WO 2005114743 | 12/2005 |
| WO | WO 2006025971 | 3/2006 |

OTHER PUBLICATIONS

First Examination Report from related European Application No. 04 788 642.9-2203. Dated: Dec. 22, 2009.

Second Office Action From Related Chinese Application No. 200480032782.1. Dated: Dec. 28, 2009.

Office Action from related U.S. Appl. No. 11/078,265, Dated: Jan. 20, 2010.

Office Action from related U.S. Appl. No. 11/807,701, Dated: Jan. 26, 2010.

Office Action from related U.S. Appl. No. 10/958,945, Dated: Jan. 28, 2010.

Second Office Action from related Chinese Application No. 200580014866.7, Dated: Nov. 25, 2009.

From related application: Chinese Patent Application No. 200580014868.6, Second Office Action dated Feb. 24, 2010.

Examiner's First Report on Patent Application re related Australian Application No. 2005246697 dated Mar. 19, 2010.

International Preliminary Examination Report re related PCT Application, PCT/US05/13725 mailed May 25, 2007.

(56) References Cited

OTHER PUBLICATIONS

The Institute of Electrical and Electronics Engineers, Inc. (2001) from Xferplus. http://www.xreferplus.com/entry.jsp?xrefid=2719358&secid=-&hh=1, Jul. 6, 2006.

Office Action from European Patent Application No. 05756258.9 dated Jun. 10, 2010.

Office Action from counterpart European Patent Application No. 05735109.0 dated Aug. 27, 2010.

Notification of Rejection/Objection in counterpart Chinese Patent Application No. 200580014868.6 dated Aug. 11, 2010.

Saito et al. "High Breakdown Voltage AlGaN-GaN Power-HEMT Design and High Current Density Switching Behavior" IEEE Transactions on Electron Devices. Vol. 50, No. 12, Dec. 2003, pp. 2528-2531.

CRC Press, *The Electrical Engineering Handbook*, Second Edition, Dorf, (1997) p. 994.

B. Gelmont, K. Kim, and M. Shur."Monte Carlo Simulation of Electron Transport in Gallium Nitrate." *Journal of Applied Physics*, vol. 74, Issue 3, (Aug. 1, 1993) p. 1818.

R. Gaska, J.W. Yang, A. Osinsky, Q. Chen, M.A. Khan, A.O. Orlov, G.L. Snider, M.S. Shur. "Electron Transport in ALGaN Heterostructures Grown on 6H-SiC Substrates." *Applied Physics Letters*, vol. 72, No. 6 (Feb. 9, 1998) p. 707.

Y. F. Wu et. al. "GaN-Based FETs for Microwave Power Amplification." *IEICE Transactions on Electronics*, E-82-C, (1999) p. 1895.

Y.F. Wu, D. Kapolnek, J.P. Ibettson, P. Parikhk, B.P. Keller, and U.K. Mishra. "Very-High Power Density ALGaN/GaN HEMTS." *IEEE Transactions on Electronic Devices*, vol. 48, Issue 3 (Mar. 2001) p. 586.

M. Micovic, A. Kurdoghlian, P. Janke, P. Hashimoto, D.W.S. Wong, J. S. Moon, L. McRay, and C. Nguyen. "ALGaN/GaN Heterojunction Field Effect Transistors Grown by Nitrogen Plasma Assisted Molecular Beam Epitaxy." *IEEE Transactions on Electronic Devices*, vol. 48, Issue 3, (Mar. 2001).

Gaska et al., "High Temperature Performance of ALGAN/GaN HFET's on SiC Substrates." *IEEE Electron Device Letters* vol. 18, No. 10, (Oct. 1997) p. 492

Ping et al., "DC and Microwave Performance of High Current ALGaN Heterostructure Field Effect Transistors Grown on P-Type SiC Substrates." *IEEE Electron Device Letters* vol. 19, No. 2, (Feb. 1998) p. 54.

L. Eastman, K. Chu, J. Smart, J. R. Shealy, "GaN Materials for High Power Microwave Amplifiers." *Materials Research Society* vol. 512 Wocsemmad, Monterey, CA (Feb. 1998) p. 3-7.

G. Sullivan et al., "High Power 10-GHz Operation of ALGaN HFET's in Insulating SiC." *IEEE Electron Device Letters* vol. 19, No. 6, (Jun. 1998) p. 198.

Wu et al., "High AL-Content ALGaN/GaN MODFETs for Ultrhigh Performance." *IEEE Electron Device Letters* vol. 19, No. 2, (Feb. 1998) p. 50.

Y. Ando, et al., "10-W/mm ALGaN-GaN HFET With a Field Modulating Plate." *IEEE Electron Device Letters* vol. 24, No. 5, (May 2003) p. 289-292.

S. Karmalkar, U.K. Mishra, "Very High Voltage ALGaN/GaN High Electron Mobility Transistors Using a Field Plate Deposited on a Stepped Insulator." *Solid-State Electronics* vol. 45, (2001) pp. 1645-1652.

W. Saito et al., "600V ALGaN/GaN Power-HEMT: Design, Fabrication and Demonstration on High Voltage DC-DC Converter." IEEE IEDM vol. 23, No. 7, (2003) pp. 587-590.

Wu et al., "High-Gain Microwave GAN HEMTS With Source-Terminated Field-Plates", Cree Santa Barbara Technology Center.

Wu et al., "30-W/MM GAN HEMTS by Field Plate Optimization", IEEE, Vol. 25, No. 3, Mar. 2004, p. 117-119.

Asano K et al: "Novel High Power AlGaAs/GaAs HFET With a Field-Modulating Plate Operated at 35 V Drain Voltage", Electron Devices Meeting, 1998. IDM '98 Technical Digest. International San Francisco, CA USA Dec. 6-9, 1998, Piscataway, NJ, USA IEEE US, Dec. 6, 1998, pp. 59-62 XP010321500.

Wakejima A et al, "High Power Density and Low Distortion Ingap Channel FETS With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.

Mok P K T et al, "A Novel High-Voltage High-Speed MESFET Using a Standard GAAS Digital IC Process" IEEE Transactions on Electron Devices, IEEE Inc. New York, US. vol. 41, No. 2, Feb. 1, 1994, pp. 246-250, XP000478051.

Li J, et al "High Breakdown Voltage GaN HFET With Field Palte" Electronics Letters, IEE Stevenage, GB vol. 37, No. 3, Feb. 1, 2001, pp. 196-197, XP006016221.

Xing H. et al. "High Breakdown Voltage ALGAN-GAN HEMTS Achieved by Multiple Field Plates" IEEE Electron Device Letters, IEEE Inc. New York, US. Vol. 25, No. 4, Apr. 2004, pp. 161-163, XP001190361.

Japanese Journal of Applied Physics, vol. 43, No. 4B, 2004, pp. 2239-2242, XP-001227744, Design and Demonstration of High Breakdown Voltage GAN High Electron Mobility Transistor (HEMT) Using Field Plate Structure for Power Electronics Applications, Saito et al.

Saito et al., Solid-State Electronics, Theoretical Limit Estimation of Lateral Wide Bandgap Semiconductor Power-Switching Device, Apr. 1, 2003, pp. 1555-1562.

Heikman et al. "Growth of FE Doped Semi-Insulating GAN by Metalorganic Chemical Vapor Deposition", Applied Physics Letters, Vol. 81, No. 3, Jul. 2002, pp. 439-441.

Heikman, Growth and Characteristics of FE-Doped GAN Journal of Crystal Growth 248 (2003) 513-517.

Kahn M A et al. "ALGAN/GAN Metal-Oxide-Semiconductor Heterostructure Field-Effect Transistors on SIC Substrates", Applied Physics Letters, American Institute of Physics. New York, US, vol. 77, No. 9, Aug. 2000, p. 1339-1341 XP000951319 ISSN: 0003-6951.

Lu W et al. "P-Type Sige Transistors With Low Gate Leakage Using SIN Gate Dielectric", IEEE Electron Device Letters, IEEE, Inc., New York, US, vol. 20, No. 10, Oct. 1999, pp. 514-516, XP000890470, ISSN: 0741-3106.

Zhang N-Q et al., "High Breakdown GAN HEMT With Overlapping Gate Structure", IEEE Electron Device Letters, IEEE, Inc. New York, US, vol. 9, Sep. 2000, pp. 373-375, XP000954354, ISSN: 0741-3106.

Tilak, V. et al., "Effect of Passivation on AlGaN/GaN HEMT Device Performance", 2000 IEEE International Symposium on Compound Semiconductors. Proceedings of the IEEE $27^{th}$ International Symposium on Compound Semiconductors (Cat. No. $00^{th}8498$), 2000 IEEE International Symposium on Compound Semiconductors Proceedings of TH, p. 357-363, XP002239700, 2000, Piscataway, NJ, USA, IEEE, USA ISBN: 0-7803-6258-6.

Applied Physics Letters, vol. 77, No. 9, Aug. 2000, AlGaN/GaN Metal-Oxide-Semiconductor Heterostructure Field-Effect Transistors on SiC Substrates, Kahn et al.pp. 1339-1340.

Japanese Patent Application Laid-open No. 22002-016245 Patent Abstracts of Japan.

Japanese Patent Application Laid-open No. 2001230407 Patent Abstracts of Japan.

Japanese Patent Application Laid-open No. 2002-343814 Patent Abstracts of Japan.

Japanese Patent Application Laid-open No. 63-087773 Patent Abstracts of Japan.

Japanese Patent Application Laid-open No. 2001-230263 Patent Abstracts of Japan.

Japanese Patent Application No. 2003-307916 (Laid-open No. 2005-079346) Patent Abstracts of Japan.

Japanese Patent Application No. 2003-081849 (Laid-open No. 2004-289038) Patent Abstracts of Japan.

Official Notice of Rejection mailed on Jun. 24, 2008, Japanese Patent Application No. 2006-526270 and comments.

The First Office Action From China Application No. 200580015278.5, Filed Mar. 24, 2005, Date May 9, 2008.

PCT International Preliminary Report for Group of Related Applications, PCT Application No. PCT/US05.09884 Dated: Aug. 25, 2008.

(56) References Cited

OTHER PUBLICATIONS

European Examination Report Application No. 05731252.2-2203 Dated: Jul. 30, 2008.
First Office Action from China, Application No. 200480032782.1, Dated Jul. 18, 2008.
Notice Requesting Submission of Opinion in Korean Patent Application No. 10-2006-7004682 dated Feb. 17, 2011.
Supplemental Examination in European Patent Application No. 05731252.2 dated May 11, 2011.
Office Action for Taiwan Patent Application No. 09312733 dated Apr. 29, 2011.
Office Action for Korean Patent Application No. 10-2006-7026090 mailed May 17, 2011.
Extended European Search Report for European Patent Application No. EP 10183441.4 dated Dec. 2, 2010.
Extended European Search Report for European Patent Application No. EP 10183607.0 dated Dec. 6, 2010.
Saito, W., et al., "Design and Demonstration of High Breakdown Voltage GAN High Electron Mobility Transistor (HEMT) Using Field Plate Structure for Power Electronics Applications" Japanese Journal of Applied Physics, Japan Society of Applied Physics, Tokyo, JP, vol. 43, No. 4B, Apr. 2004, pp. 2239-2242.
"High Power Density and Low Distortion InGaP Channel FET's with Field-Modulating Plate", Wakejima, et al., IEICE Trans Electron. vol. E85-C. No. 12, Dec. 2002. pp. 2041-2045.
"Very high voltage AlGaN/GaN high electron mobility transistors using a field plate deposited on a stepped insulator", Karmalker, et al., Solid-State Electronics 45 (2001) pp. 1645-1652.
Extended European Search Report from Appl. No. 11183396-8-2203/2432021, dated: Feb. 22, 2012.
Extended European Search Report from Appl. No. 11183404.0-2203, dated: Feb. 28, 2012.
Examiner's Report from Canadian Appl. No. 2566361, Dated: Feb. 7, 2012.
Extended European Search Report from Application No. 11183655.7-2203, dated: Mar. 1, 2012.
Examiner's Report for Canadian Patent Application No. 2,566,756, dated Feb. 16, 2012.
Examiner's Report for Canadian Patent Application No. 2,564,955, dated Feb. 24, 2012.
Summary of "Notice of Reasons for Rejection", Japanese Patent Application No. 2008-500703, dated Jan. 10, 2012.
Summary of "Notice of Reasons for Rejection", Japanese Patent Application No. 2007-238147, dated Jan. 24, 2012.
Office Action from U.S. Appl. No. 10/786,755, dated Jun. 22, 2011.
Office Action from U.S. Appl. No. 11/807,701, dated May 18, 2010.
Office Action from U.S. Appl. No. 11/807,701, dated Jan. 26, 2010.
Office Action from U.S. Appl. No. 12/321,493, dated Aug. 18, 2010.
Office Action from U.S. Appl. No. 12/321,493, dated Jun. 23, 2011.
Office Action from U.S. Appl. No. 12/321,493, dated Jan. 26, 2011.
Office Action from U.S. Appl. No. 12/437,505, dated Jul. 21, 2010.
Office Action from U.S. Appl. No. 10/958,945, dated Sep. 23, 2011.
Office Action from U.S. Appl. No. 10/958,945, dated Apr. 1, 2011.
Office Action from U.S. Appl. No. 10/958,945, dated Sep. 1, 2010.
Office Action from U.S. Appl. No. 10/958,945, dated Jan. 28, 2010.
Office Action from U.S. Appl. No. 11/078,265, dated Jun. 15, 2011.
Office Action from U.S. Appl. No. 11/078,265, dated Jan. 20, 2010.
Office Action from U.S. Appl. No. 11/600,617, dated Dec. 22, 2009.
Office Action from U.S. Appl. No. 11/584,135, dated Jun. 15, 2011.
Office Action from U.S. Appl. No. 11/901,103, dated Feb. 11, 2011.
Office Action from U.S. Appl. No. 11/901,103, dated Jun. 8, 2010.
Office Action from U.S. Appl. No. 11/078,265, dated Oct. 25, 2011.
Summary of Decision of Rejection for Japanese Application No. 2007-513132, dated Mar. 13, 2012.
Decision of Rejection from Taiwanese Application No. 094111532. dated Apr. 11, 2012.
Office Action from Taiwanese Patent Application No. 094114829, dated May 29, 2012.
Office Action and Search Report from Taiwanese Patent Application No. 093127333, dated Jul. 5, 2012.
Office Action and Search Report from Taiwanese Patent Application No. 095103561, dated Jul. 24, 2012.
Summary of Notice of Reasons for Rejection for Japanese Patent Application No. JP 2007-513132 mailed Sep. 13, 2011.
Summary of Notice of Reasons for Rejection for Japanese Patent Application No. 2007-513167 dated Dec. 6, 2011.
Decision of Rejection for counterpart Japanese Patent Application No. 2006-526270 dated Dec. 13, 2011.
Summary of Notice of Reasons for Rejection for counterpart Japanese Patent Application No. JP 2007-513155 mailed Sep. 13, 2011.
Office Action for Taiwan Patent Application No. 094111532 issued Jul. 4, 2011.
Office Action for Korean Patent Application No. 10-2006-7026207 mailed Jul. 26, 2011.
Notice of Reasons for Rejection for Japanese Patent Appl. No. 2007-513167. dated Jan. 9, 2013.
Pretrial Examination Communication from Examiner from Japanese Patent Appl. No. 2008-500703, Appeal No. 2013-05298, dated Jun. 3, 2013.
Office Action from U.S. Appl. No. 10/958,945, dated May 15, 2013.
Response to Office Action U.S. Appl. No. 10/958,945, dated Mar. 14, 2013.
Office Action from U.S. Appl. No. 10/958,945, dated Mar. 14, 2013.
Office Action from U.S. Appl. No. 13/245,579, dated Jan. 31, 2013.
Office Action from U.S. Appl. No. 13/072,449, dated Dec. 13, 2012.
Response to Office Action U.S. Appl. No. 13/072,449, filed Feb. 13, 2013.
First Office Action from Chinese Patent Appl. No. 2011102654868. dated Jun. 19, 2013.
Notice of Reasons for Rejection from Japanese Patent Appl. No. 2007-513132. dated Jun. 25, 2013.
Office Action from Japanese Patent Appl. No. 2008-500703. dated Jun. 25, 2013.
A.J. Bergsma, "A Comprehensive Design Method for Dual Gate MOSFET Mixers". Ottawa Carleton Institute for Electrical Engineering. Dept. of Electronics., Carleton University. Ottawa. Canada. May 1995. © 1998 AJ Bergsma.
Vetury, et al., "Performance and RF Reliability of GaN-ON-SiC HEMTs Using Dual-Gate Architectures", Air Force Research Laboratory. Jul. 2006, Air Force Contract No. FA8650-05-C-5411. Wright-Patterson Air Force Base. OH 45433-7750.
Interrogation from Japanese Patent Application No. 2007-513155. dated Jun. 25, 2013.
Decision of Rejection from Japanese Patent appl. No 2007-513167. dated Jul. 4, 2013.
Office Action from Taiwanese Patent Appl. No. 095103561. dated Jun. 27, 2013.
Interrogation from Japanese Patent Application No. 2007-513132, dated Sep. 25, 2012.
Decision of Rejection from Japanese Patent Application No. 2007-513155, dated Nov. 13, 2012.
European Search Report from European Patent Application No. 12171403.4-2203/2515339, dated Nov. 12, 2012.
European Search Report from European Patent Application No. 12171401 8-2203/2515338, dated Nov. 13, 2012.
Decision of Rejection from Japanese Patent Application No. 2008-500703, dated Nov. 20, 2012.
Examination Report for European Patent Application No. 05756258.9 dated Dec. 11, 2012.
Office Action from Taiwanese Patent Application No. 094111532, dated Nov. 23, 2012.
Office Action from U.S. Appl. No. 10/958,945, dated Aug. 16, 2013.
Office Action from U.S. Appl. No. 11/078,265, dated Aug. 15, 2013.
Office Action from U.S. Appl. No. 13/355,766, dated Aug. 9, 2013.
Office Action from Taiwanese Patent Appl. No. 101131917, dated Jul. 26, 2013.
Examination Report from European Patent Appl. No. 06 718 166.9, dated Aug. 13, 2013.
European Search Report from European Patent Appl. No. 12180744.0-1552, dated Dec. 12, 2013.
Examination Report from Canadian Patent Appl. No. 2,566,756. dated Nov. 7, 2013.

(56) References Cited

OTHER PUBLICATIONS

Examination Report from Canadian Patent Appl. No. 2,564,955. dated Dec. 6, 2012.

Notice of Reasons for Rejection from Japanese Patent Appl. No. 2008-500703. dated Nov. 12, 2013.

Office Action from U.S. Appl. No. 13/245,579. dated Oct. 25, 2013.

* cited by examiner

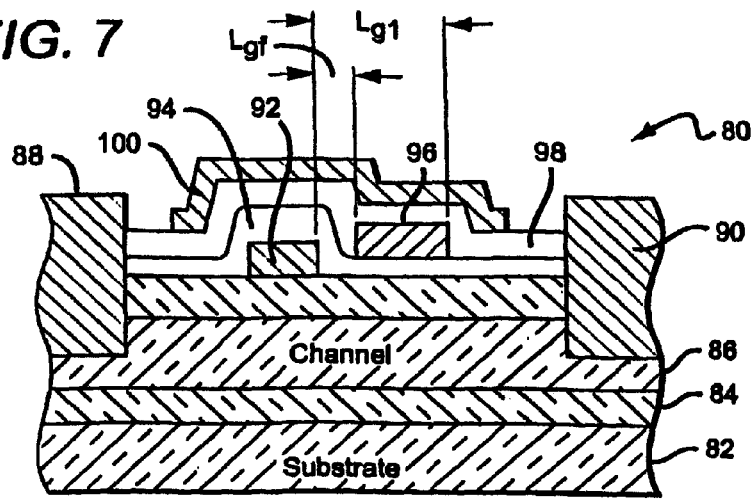
FIG. 7
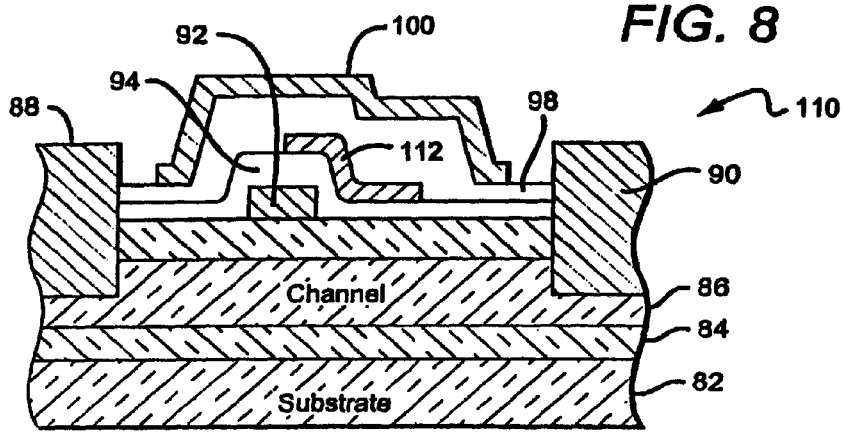
FIG. 8
FIG. 10
| | No FP | FP connected to gate | FP connected to source |
|---|---|---|---|
| MSG at 4 GHz (dB) | 18.6 | 14.7 | 19.9 |
| S12 at 4 GHz | 0.0795 | 0.136 | 0.0572 |
| S12 compared to none-FP device (%) | 100% | 171% | 72% |

WIDE BANDGAP TRANSISTORS WITH MULTIPLE FIELD PLATES

This application is a Divisional application of application Ser. No. 10/976,422, filed Oct. 29, 2004, now U.S. Pat. No. 7,573,078 and claims the benefit of provisional application Ser. No. 60/570,518 to Wu et al., which was filed on May 11, 2004.

BACKGROUND OF THE INVENTION

1. Field of the Invention

The present invention relates to transistors and particularly to transistors utilizing field plates.

2. Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821]. AlGaN/GaN HEMTs can also have 2DEG sheet densities in excess of $10^{13} cm^{-2}$ and relatively high electron mobility (up to 2019 $cm^2/Vs$) [R. Gaska, et al., *Electron Transport in AlGaN—GaN Heterostructures Grown on 6H-SiC Substrates*, Appl.Phys.Lett. 72, (1998), pp. 707-709]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., *GaN-Based FETs for Microwave Power Amplification*, IEICE Trans. Electron. E-82-C, (1999). pp. 1895-1905]. More recently, AlGaN/GaN HEMTs grown on SiC have shown a power density of 9.8 W/mm at 8 GHz [Y. F. Wu, et al., *Very-High Power Density AlGaN/GaN HEMTS*, IEEE Trans. Electron. Dev. 48, (2001), pp. 586-590] and a total output power of 22.9 W at 9 GHz [M. Micovic, et al., *AlGaN/GaN Heterojunction Field Effect Transistors Grown by Nitrogen Plasma Assisted Molecular Beam Epitaxy*, IEEE Trans. Electron. Dev.48, (2001), pp. 591-596].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., *High-Temperature Performance of AlGaN/GaN HFET's on SiC Substrates*, IEEE Electron Device Letters, 18, (1997), pp. 492-494; and Wu et al. "High Al-content AlGaN/GaN HEMTs With Very High Performance", IEDM-1999 Digest, pp. 925-927, Washington D.C., December 1999. Some of these devices have shown a gain-bandwidth product (fT) as high as 100 gigahertz (Lu et al. "AlGaN/GaN HEMTs on SiC With Over 100 GHz ft and Low Microwave Noise", IEEE Transactions on Electron Devices, Vol. 48, No. 3, March 2001, pp. 581-585) and high power densities up to 10 W/mm at X-band (Wu et al., "Bias-dependent Performance of High-Power AlGaN/GaN HEMTs", IEDM-2001, Washington DC, Dec. 2-6, 2001) and Wu et al., *High Al-Content AlGaN/GaN MODFETs for Ultra-high Performance*, IEEE Electron Device Letters 19, (1998), pp. 50-53].

Electron trapping and the resulting difference between DC and RF characteristics have been a limiting factor in the performance of these devices. Silicon nitride (SiN) passivation has been successfully employed to alleviate this trapping problem resulting in high performance devices with power densities over 10W/mm at 10 Ghz. For example, U.S. Pat. No. 6,586,781, which is incorporated herein by reference in its entirety, discloses methods and structures for reducing the trapping effect in GaN-based transistors. However, due to the high electric fields existing in these structures, charge trapping is still an issue.

Field plates have been used to enhance the performance of GaN-based HEMTs at microwave frequencies [See S Kamalkar and U.K. Mishra, *Very High Voltage AlGaN/GaN High Electron Mobility Transistors Using a Field Plate Deposited on a Stepped Insulator*, Solid State Electronics 45, (2001), pp. 1645-1662]. These approaches, however, have involved a field plate connected to the gate of the transistor with the field plate on top of the drain side of the channel. This can result in a significant field plate to drain capacitance and the field plate being connected to the gate adds additional gate-to-drain capacitance (Cgd) to the device. This can not only reduce gain, but can also cause instability due to poorer input-output isolation.

SUMMARY OF THE INVENTION

The present invention provides transistors with multiple field plates, the topmost of which is electrically connected to the source electrodes with the intermediate ones being connected to the source or gate electrodes. One embodiment of a transistor according to the present invention comprises an active region. Source and drain electrodes are formed in contact with the active region and a gate is formed between the source and drain electrodes on the active region. A plurality of spacer layers and field plates are included, the first of the spacer layers being on at least part of the surface of the active region between the gate and the drain and source electrodes and the first of the field plates on the first of the spacer layers. The remaining spacer layers and field plates are arranged alternately over the first of spacer layers and the first of the field plates with the topmost of the field plates electrically connected to the source electrode and each of the field plates below electrically connected to the gate or source electrode.

Another embodiment of a transistor according to the present invention comprises an active region, with source and drain electrodes in contact with the active region. A gate is between the source and drain electrodes and on the active region. A plurality of field plates are arranged over the active region, each of which extends from the edge of the gate toward the drain electrode, and each of which is isolated from the active region and from the others of the field plates. The topmost of the field plates is electrically connected to the source electrode and each of the others of the field plates are electrically connected to the gate or the source electrode.

These and other further features and advantages of the invention would be apparent to those skilled in the art from the following detailed description, taking together with the accompanying drawings, in which:

BRIEF DESCRIPTION OF THE DRAWINGS

FIG. 7 is a sectional view of one embodiment of a MESFET according to the present invention;

FIG. 8 is a sectional view of another embodiment of a MESFET according to the present invention;

FIG. 10 is a table comparing the operating characteristics of a HEMT according to the present invention compared to a HEMT with no field plate, a HEMT with a gate connected field plate and a HEMT with a source connected field plate;

DETAILED DESCRIPTION OF THE INVENTION

Figure 1:
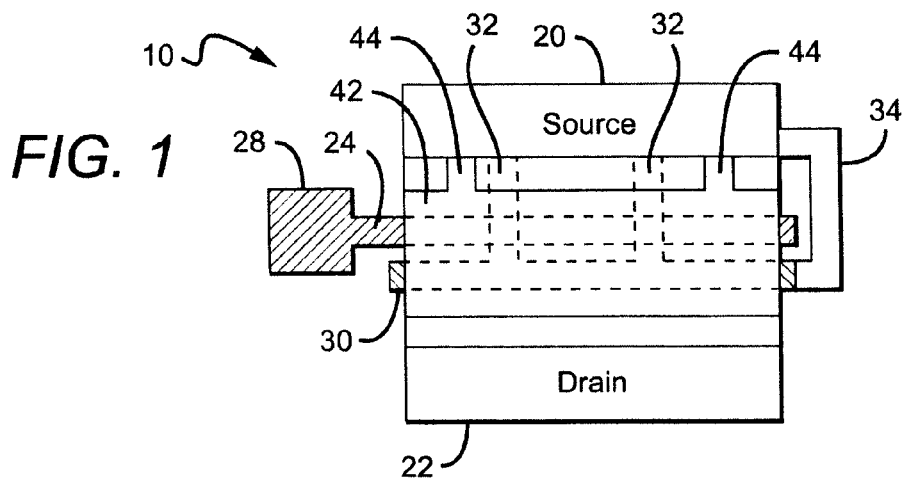
FIG. 1 is a plan view of one embodiment of a HEMT according to the present invention.

The multiple field plate arrangements according to the present invention can be used with many different transistor structures, such as transistor structures made of wide bandgap materials. Transistors generally include an active region comprising semiconductor layers, with metal source and drain electrodes formed in electrical contact with the active region, and a gate formed between the source and drain electrodes for modulating electric fields within the active region. A first spacer layer is formed above the active region, over at least a portion of the surface of the active region between the gate and the drain. The first spacer layer can comprise a dielectric layer, or a combination of multiple dielectric layers. The first spacer layer preferably covers the gate and the topmost surface of the active region between the gate and source and drain electrodes, although as described below it can cover less.

A conductive first field plate is formed on the first spacer layer with the first spacer layer providing isolation between the field plate and the gate and active region below. The first field plate extends a distance $L_{f1}$ from the edge of the gate toward the drain electrode. The first field plate can be electrically connected to either the source electrode or the gate.

A second spacer layer is formed over at least part of the first field plate and part of the surface of the first spacer layer between the gate and the drain electrode. In a preferred embodiment, however the second spacer covers the first field plate and the top exposed surfaces of the transistor structure, which is typically the first spacer layer. A second field plate is formed on the second spacer layer with the second spacer layer providing isolation between the first and second field plates, and depending on the coverage of the first spacer layer, isolation between the gate and active region.

Other transistor structures according to the present invention can have more than two field plates. The topmost field plate is typically electrically connected to the source electrode, while the intermediate field plates are electrically connected to either the gate or the source electrode.

This field plate arrangement can reduce the peak electric field in the device, resulting in increased breakdown voltage and reduced trapping. The reduction of the electric field can also yield other benefits such as reduced leakage currents and enhanced reliability. By having the field plate electrically connected to the source electrode, the reduced gain and instability resulting from gate connected field plates is reduced.

When arranged according to the present invention, the shielding effect of a source-connected field plate can reduce $C_{gd}$, which enhances input-output isolation.

One type of transistor that can utilize the multiple field plate arrangement according to the present invention is a high electron mobility transistor (HEMT), which typically includes a buffer layer and a barrier layer on the buffer layer. A two dimensional electron gas (2DEG) layer/channel is formed at the heterointerface between the buffer layer and the barrier layer. A gate electrode is formed on the barrier layer between source and drain electrodes. The HEMT also includes the multiple spacer layer and field plate arrangement described above.

Another type of transistor that can utilize the multiple field plate arrangement according to the present invention is a field effect transistor and particularly a metal semiconductor field effect transistor (MESFET), which typically includes a buffer layer and a channel layer on the buffer layer. A gate is formed on the channel layer between source and drain electrodes and the MESFET also includes the multiple spacer layer and field plate arrangement described above.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Figure 2:
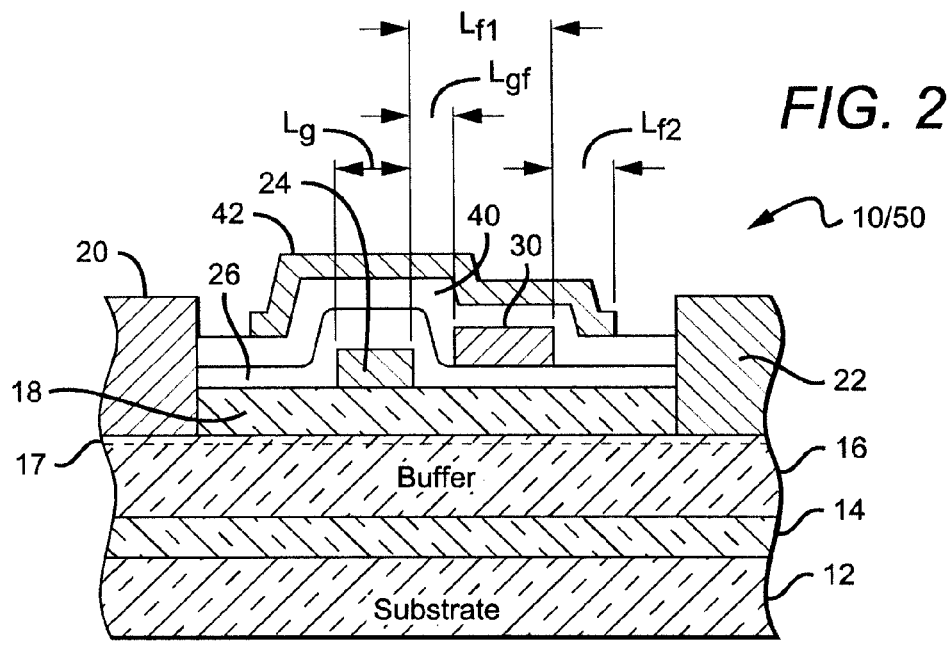
FIG. 2 is a sectional view of one embodiment of a HEMT according to the present invention.

FIGS. 1 and 2 show one embodiment of a HEMT 10 according to the present invention that is preferably Group-III nitride based although other material systems can also be used. The HEMT 10 comprises a substrate 12 which can be made from silicon carbide, sapphire, spinet, ZnO, silicon, gallium nitride, aluminum nitride, or any other material or combinations of materials capable of supporting growth of a Group-III nitride material. A nucleation layer 14 can be formed on the substrate 12 to reduce the lattice mismatch between the substrate 12 and the next layer in the HEMT 10. The nucleation layer 14 should be approximately 1000 angstroms (Å) thick, although other thicknesses can be used. The nucleation layer 14 can comprise many different materials, with a suitable material being $Al_zGa_{1-z}N$ ($0<=z<=1$), and layer 14 can be formed on the substrate 12 using known semiconductor growth techniques such as Metal Oxide Chemical Vapor Deposition (MOCVD), Hydride Vapor Phase Epitaxy (HVPE), or Molecular Beam Epitaxy (MBE).

The formation of a nucleation layer 14 can depend on the material used for the substrate 12. For example, methods of forming a nucleation layer 14 on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

The HEMT 10 further comprises a high resistivity buffer layer 16 formed on the nucleation layer 14. The buffer layer 16 can comprise doped or undoped layers of Group III-nitride materials with a preferred buffer layer 16 made of a Group III-nitride material such as $Al_xGa_yIn_{(1-x-y)}N$ ($0<=x<=1$, $0<=y<=1$, $x+y<=1$). Other materials can also be used for the buffer layer 16 such as GaN that is approximately 2 μm thick, with part of the buffer layer doped with Fe.

A barrier layer 18 is formed on the buffer layer 16 such that the buffer layer 16 is sandwiched between the barrier layer 18 and the nucleation layer 14. Like the buffer layer 16, the barrier layer 18 can comprise doped or undoped layers of Group III-nitride materials. Exemplary HEMT structures are illustrated in U.S. Pat. Nos. 6,316,793, 6,586,781, 6,548,333 and U.S. Published Patent Application Nos. 2002/0167023 and 2003/00020092 each of which is incorporated by reference as though fully set forth herein. Other nitride based HEMT structures are illustrated in U.S. Pat. Nos. 5,192,987 and 5,296,395 each of which is incorporated herein by reference as if fully set forth herein. The buffer and barrier layers 16, 18 can be made using the same methods used to grow the nucleation layer 14. Electric isolation between the devices is done with mesa etch or ion implementation outside the active HEMT.

Metal source and drain electrodes 20, 22 are formed making ohmic contact through the barrier layer 18, and a gate 24 is formed on the barrier layer 18 between the source and drain electrodes 20, 22. Electric current can flow between the source and drain electrodes 20, 22 through a 2DEG 17 induced at the heterointerface between the buffer layer 16 and the barrier layer 18 when the gate 24 is biased at the appropriate level. The formation of source and drain electrodes 20, 22 is described in detail in the patents and publications referenced above.

The source and drain electrodes 20, 22 can be made of different materials including but not limited to alloys of titanium, aluminum, gold or nickel. The gate 24 can also be made of different materials including but not limited to gold, nickel, platinum, titanium, chromium, alloys of titanium and tungsten, or platinum silicide. The gate 24 can have many different lengths ($L_g$), with a suitable gate length being to the range of 0.1 to 2 microns, although other gate lengths can be used. In one embodiment according to the present invention a preferred gate length ($L_g$) is approximately 0.5 microns.

A first non-conducting spacer layer 26 can be formed at least over a portion of the surface of the barrier layer between the gate and drain electrode, with a preferred first spacer layer formed over the gate 24 and the surface of the barrier layer 18 between the gate 24 and the source and drain electrodes 20, 22. The first spacer layer 26 can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof. The spacer layer can be many different thicknesses, with a suitable range of thicknesses being approximately 0.05 to 2 microns. As best shown in FIG. 1, the gate 24 is contacted at a gate contact 28.

Figure 9:
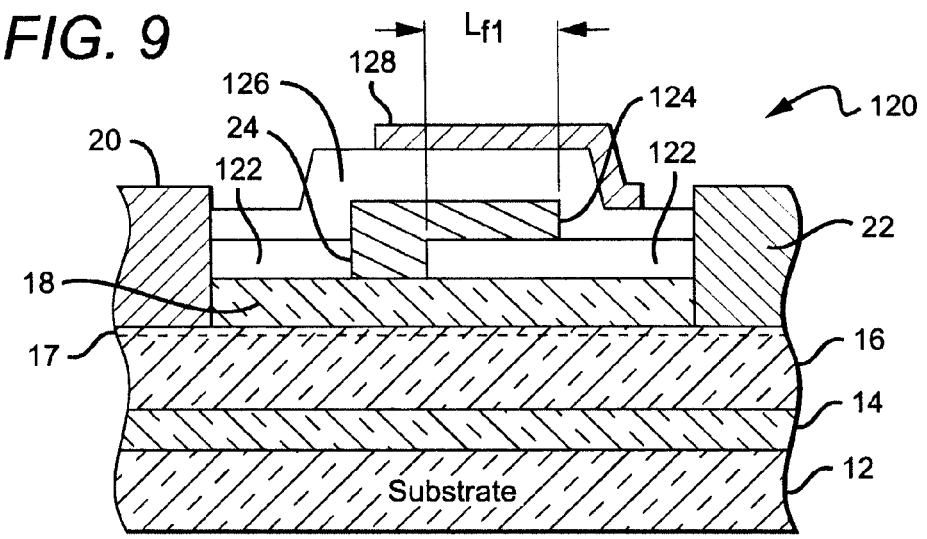
FIG. 9 is a sectional view of another embodiment of a HEMT according to the present invention.

When the first spacer layer 26 is formed before device metallization the spacer layer can comprise an epitaxial material such as a Group III nitride material having different Group III elements such as alloys of Al, Ga, or In, with a suitable spacer layer material being $Al_xGa_{1-x}N$ ($0≤x≤1$). After epitaxial growth of the barrier layer 18, the first spacer layer 26 can be grown using the same epitaxial growth method. The first spacer layer 26 is then etched such that the gate 24, source electrode 20 and drain electrode 22 can be properly formed in contact with the 2DEG 17. This arrangement is particularly applicable to HEMTs (and MESFETs) having a gate with an integral first field plate as shown in FIG. 9 and described below.

A first field plate 30 is formed on the spacer layer 26 between the gate 24 and the drain contact 22, with the field plate 30 being in close proximity to the gate 24 but not overlapping it. The spacer layer 26 is arranged to provide isolation between the first field plate 30 and the layers below. A space between the gate 24 and field plate ($L_{gf}$) remains and should be wide enough to further isolate from the first field plate 30, while being small enough to maximize the field effect provided by the first field plate 30. If $L_{gf}$ is too wide the field effect will be reduced. In one embodiment according to the present invention $L_{gf}$ should be 0.4 microns or less, although larger and smaller spaces can also be used.

The first field plate 30 can extend different distances $L_{f1}$ over the barrier layer from the edge of the gate 24 with a suitable range of distances being 0.1 to 1.0 micron, although other distances can also be used. The field plate 30 can comprise many different conductive materials with a suitable material being a metal deposited using standard metallization methods. In one embodiment according to the present invention the field plate 30 comprises the same metal as the feature that it is connected to as described below.

The first field plate 30 can be electrically connected to either the source contact 20 or the gate 24. FIG. 1 shows one embodiment according to the present invention wherein the first field plate 30 is connected to the source contact, with two alternative connection structures being shown, although other connection structures can also be used. First conductive buses 32 (shown in phantom) can be formed on the spacer layer 26 to extend between the first field plate 30 and the source contact 20. Different numbers of buses 32 can be used although the more buses 32 that are used, the greater the unwanted capacitance that can be introduced by the buses. The buses 32 should have a sufficient number so that current effectively spreads from the source contact 20 into the first field plate 30, while covering as little of the HEMTs active region as possible, with a suitable number of buses 32 being two.

The first field plate 30 can also be electrically connected to the source contact 20 through a first conductive path 34 that runs outside of the active region of the HEMT 10 and is connected to the source contact 20. As shown in FIG. 1, the path 34 runs outside the active area of the HEMT at the edge opposite the gate contact 28. In alternative embodiments according to the present invention, the conductive path could run outside the active area of the HEMT 10 on the side of the gate contact 28, or the HEMT 10 could include two or more conductive paths running on one or both sides of the HEMT 10.

Figure 3:
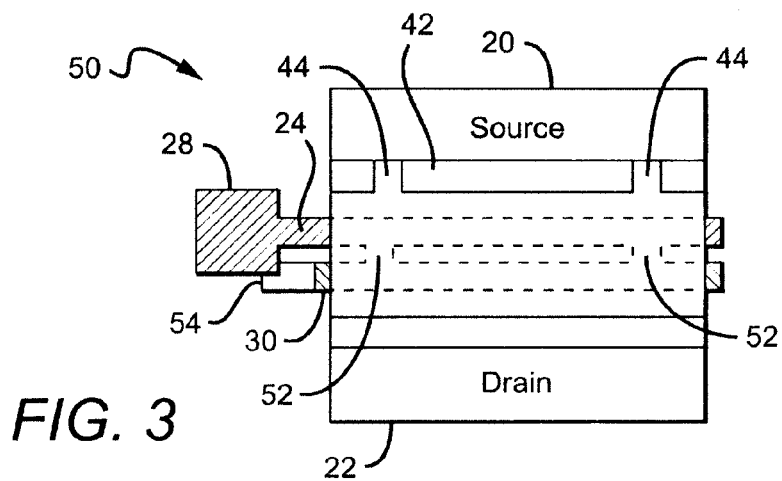
FIG. 3 is a plan view of another embodiment of a HEMT according to the present invention.

FIG. 3 shows another embodiment of a HEMT 50 according to the present invention that is similar to the HEMT 10 in FIG. 1 and has the same sectional view as shown in FIG. 2. For the features same or similar features for the HEMT 50 in FIG. 3 (and for the figures that follow), the same reference numerals from FIGS. 1 and 2 will be used with the understanding that the description of the features above applies equally to the HEMT 50.

Referring to FIGS. 2 and 3, the HEMT 50 comprises a substrate 12, nucleation layer 14, buffer layer 16, 2DEG 17, barrier layer 18, a source electrode 20, drain electrode 22, gate 24, first spacer layer 26, gate contact 28 and first field plate 30. However, instead of the first field plate being connected to the source electrode 20, it is connected to the gate 24 and FIG. 3 shows two alternative gate connection structures that can be used according to the present invention, although other connection structures can also be used. One connection structure can be conductive paths in the form of conductive vias 52 (shown in phantom), which can be formed running from the first field plate 30 to the gate 24, through the first spacer layer 26. The vias 52 provide an electrical connection between the gate 24 and first field plate 30. The vias 52 can be formed by first forming holes in the first spacer layer 26, such as by etching, and then filling the holes with a conductive material either in a separate step or during formation of the first field plate 30. The vias 52 can be arranged periodically down the first field plate 30 to provide for effective current spreading from the gate 24 to the field plate 30. By connecting to the gate 24 the gate conductance is increased, which can allow a greater device width for each unit cell.

The first field plate 30 can also be connected to the gate 24 by a second conductive path 54 (shown in FIG. 3) that runs outside of the active region of the HEMT 50. The conductive path 54 can connect to the gate contact 28 or a portion of the gate 24 outside of the HEMTs active region, such as the portion of the gate 24 opposite the gate contact 28.

The HEMTs 10 and 50 also comprise a second non-conducting spacer layer 40 (shown in FIG. 2) that is formed over the first field plate 30 and at least a portion of the top surface of HEMT between the first field plate and the drain, with a preferred second spacer layer 40 as shown covering the first field plate and the exposed surface of the first spacer layer 26. The second spacer layer 40 can be formed of the same material or layer materials as the first spacer layer 26 and can have a total thickness in the range of 0.05 to 2 microns.

For HEMTs 10 and 50 the second field plate 42 can then be deposited on the second spacer layer 40. Different second field plates according to the present invention can provide different coverage, with the second field plate 42 as shown overlapping the gate 24. Another portion extends from over the edge of the first field plate 30 toward the drain electrode 22 a distance $L_{f2}$, which can be in the range of 0.2 to 5 microns.

The second field plate 42 is connected to the source electrode 20 and many different connecting structures can be used. Second conductive buses 44 can be formed on the second spacer layer 40 to extend between the second field plate 42 and the source electrode 20. Different numbers of buses 44 can be used so that current effectively spreads from the source electrode 20 into the second field plate 42, while not covering too much of the active region such that unwanted capacitance is introduced. The first field plate 30 can also be electrically connected to the source electrode 20 through a third conductive path (not shown) that runs outside of the active region of the HEMTs 10 and 50 and is coupled to the source electrode 20.

After deposition of the second field plate 42 and its connection to the source electrode 20, the active structure can be covered by a dielectric passivation layer (not shown), such as silicon nitride. Methods of forming the dielectric passivation layer are described in detail in the patents and publications referenced above.

Figure 4:
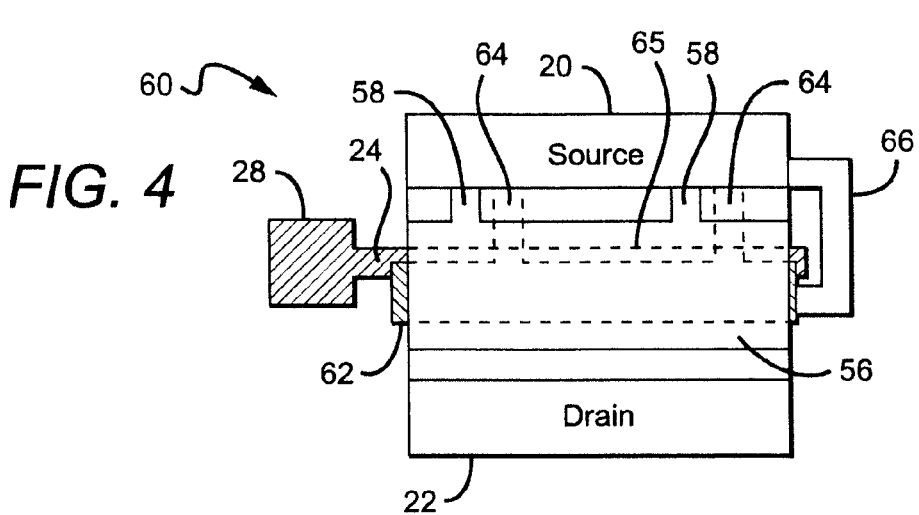
FIG. 4 is a plan view of another embodiment of a HEMT according to the present invention.
Figure 5:
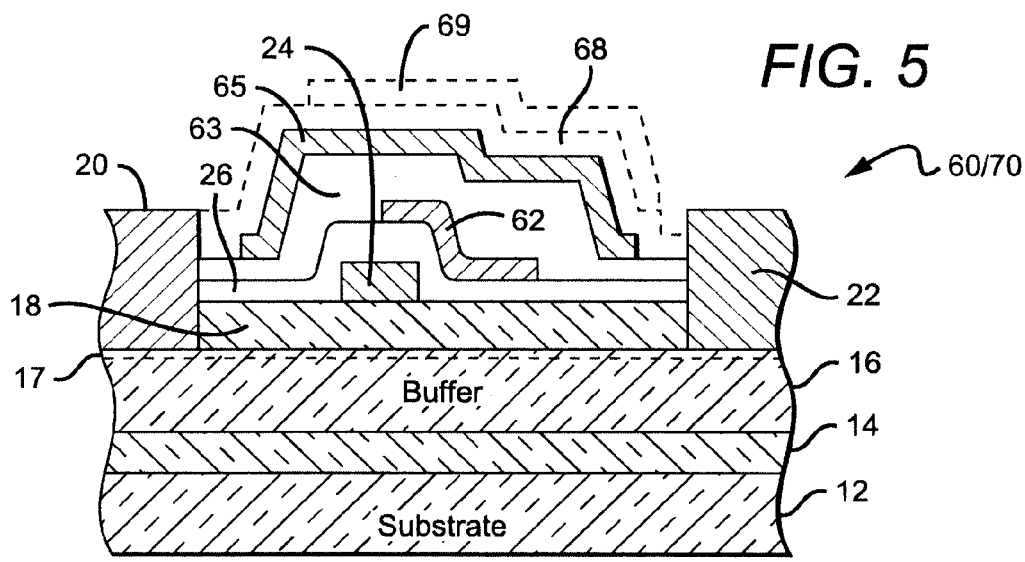
FIG. 5 is a sectional view of another embodiment of a HEMT according to the present invention.

FIGS. 4 and 5 show another embodiment of a HEMT 60 according to the present invention having many features that are similar to those in HEMT 10 and 50. HEMT 60 comprises a substrate 12, nucleation layer 14, buffer layer 16, 2DEG 17, barrier layer 18, source electrode 20, drain electrode 22, gate 24, spacer layer 26 and gate contact 28. The HEMT 60 also comprises a first field plate 62 that is formed on the spacer layer 26 primarily between the gate 24 and the drain electrode 22, but also overlapping a portion of the gate 24. For the HEMTs 10 and 50 in FIGS. 1-3, $L_{gf}$ (best shown in FIG. 2) is relatively small, which can present some difficulties during fabrication. By having the field plate 62 overlap the gate 24, the HEMT 60 can be fabricated without having to meet the tolerances of $L_{gf}$. The overlapping section of the field plate 62, however, can introduce additional unwanted capacitance. In determining whether to use an overlapping field plate or non-overlapping field plate, the ease of manufacturing must be balanced with the reduced capacitance. The HEMT 60 also comprises either buses 64 or a conductive path 66 to electrically connect the field plate 62 to the source electrode 20.

Figure 6:
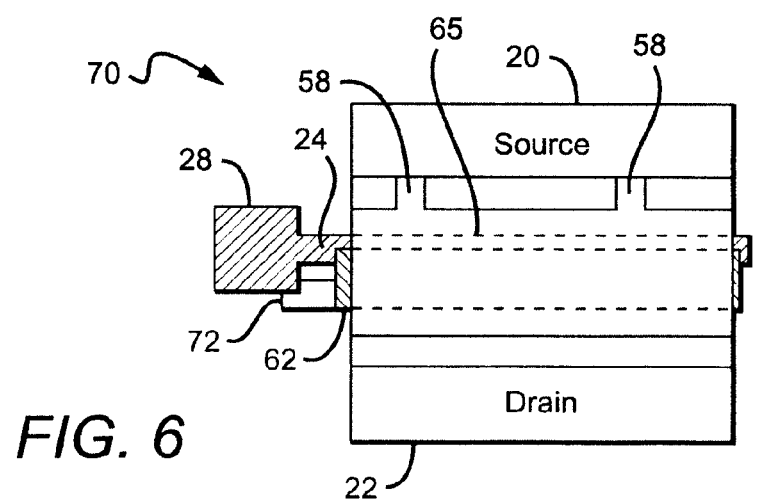
FIG. 6 is a plan view of another embodiment of a HEMT according to the present invention.

FIG. 6 shows another embodiment of a HEMT 70 that is similar to the HEMT 50 shown in FIG. 4 and can have the same sectional view as shown in FIG. 5. The field plate 62 in HEMT 70, however, is connected to the gate 24 either by gate vias (not shown) that run between the field plate 62 and the gate through the spacer layer 26 or by a second conductive path 72.

Similar to HEMTs 10 and 50 shown in FIGS. 1-3, HEMTs 60 and 70 also comprise a second non-conducting spacer layer 63 and a second field plate 65. Second conductive buses 58 or a third conductive path (not shown) can be used to connect the second field plate 56 to the source electrode 20.

Each of the HEMTs 10, 50, 60, 70 described above (as well as the HEMTs and MESFETs described below) can also comprise more than two spacer layers and field plates, wherein the topmost field plate is connected to the source and the intermediate field plates are connected to the source or gate. For example, FIG. 5 shows a third spacer layer 68 and third field plate 69 (shown in phantom) wherein the third field 69 that can extend from the edge of the second field plate 65 toward the drain electrode 22 and is connected to the source electrode 20. The first and second field plates 62, 65 are connected to the source electrode 20 or gate 24.

The structures of the present invention can also be used in other types of transistors made of other material systems. FIG. 7 shows one embodiment of a MESFET 80 according to the present invention that is silicon carbide based. MESFET 80 comprises a silicon carbide substrate 82 on which a silicon carbide buffer 84 and a silicon carbide channel layer 86 are formed with the buffer 84 sandwiched between the channel layer 86 and substrate 82. Source and drain electrodes 88, 90 are formed in contact with the channel layer 86 and a gate 92 is formed on the channel layer 86 between the source and drain electrodes 88, 90.

A non-conducting spacer layer 94 is formed over the gate 92 and the surface of the channel layer 86 between the gate 92 and the source and drain electrodes 88, 90. Similar to the spacer layer 26 described above and shown in FIGS. 1-3, the spacer layer 94 can comprise a layer of non-conducting material such as a dielectric, or a number of different layers of non-conducting materials such as different dielectrics.

A first field plate 96 is formed on the spacer layer 94 between the gate 92 and the drain contact 90, with the field plate 96 arranged in a similar fashion to the field plate 30 in FIGS. 1-3 and has a similar $L_{gf}$ and $L_{f1}$. The field plate 96 can also be connected to either the source contact 88 or the gate 90 using the same structure for connecting field plate 30.

A second non-conducting spacer layer 98 is formed over the gate 92 and first spacer layer 94 and is similar to second spacer layer 40 described above and shown in FIGS. 1-3. Similarly, a second field plate 100 is provided on the second spacer layer 98 that is similar to the second field plate 42 and is similarly connected to the source electrode 88.

FIG. 8 shows another embodiment of a silicon carbide MESFET 110 according to the present invention that has similar features of the MESFET 80 including a substrate 82, buffer 84, channel layer 86, source electrode 88, drain electrode 90, gate 92 and spacer layer 94. MESFET 110 also comprises a field plate 112 that overlaps the gate 92 and provides an embodiment that is easier to manufacture than a MESFET with a non-overlapping field plate, but can introduce additional capacitance. Field plate 112 is arranged in similar manner as field plate 62 in FIGS. 3-5 and is similarly connected to the source electrode 88 or the gate 92. MESFET 110 also comprises a second spreader layer 98 and a second field plate 100 connected to the source electrode 88.

FIG. 9 shows another embodiment of a HEMT 120 that is similar to the HEMT 10 in FIGS. 1 and 2 and comprises a substrate 12, nucleation layer 14, buffer layer 16, 2DEG 17, barrier layer 18, source electrode 20, drain electrode 22, and gate 24. HEMT 120 also comprises a spacer layer 122, but unlike the spacer layers described above, spacer layer 122 does not cover the gate 24. It instead only covers the surface of the barrier layer 18 between the gate 24 and the source and drain contacts 20, 22. It is understood, however, that the spacer layer can cover less than all of the surface layer, but should cover at least part of the surface between the gate 24 and the drain electrode 22 with the coverage being sufficient to support a field plate in isolation from the barrier layer 18.

A field plate 124 can then be formed on the spacer layer 122, with the field plate being integral with the gate 24 such that the field plate 124 contacts the gate 24 down its length. The field plate 124 extends a distance $L_{f1}$ on the spacer layer 122 toward the drain contact 22. In this arrangement, the spacer layer 122 can be epitaxial as described above, wherein the spacer layer is deposited on the barrier layer 18 and then etched such that the source and drain electrodes 20, 22 and gate 24 can be deposited in contact with the barrier layer 18. The field plate 124 can then be deposited on the spacer layer 122 integral with the gate 24 or the field plate 124 can be deposited during the same step that the gate 24 is deposited.

It is understood that the integral field plate arrangement of FIG. 9 can be used with other transistors such as MESFETs. It is also understood that transistors with this field plate arranged can also have more than two spacer layers and field plates.

A second spacer layer 126 and second field plate 128 are also included, similar to second spacer layer 40 and field plate 42 described above and shown in FIGS. 1-3. It is understood HEMT 120 can comprise more than two field plates with the intermediate field plates electrically connected to the gate or source electrode and the top field plate electrically connected to the source electrode. It is also understood that this multiple field plate arrangement can also be used with other transistors made of different material systems, such as with MESFETs made of SiC.

FIG. 10 shows a table 130 comparing the operating characteristics of GaN based HEMTs with no field plate, field plate connected to the gate, and a field plate connected to the source electrode. The tests were conducted on HEMTs having a gate length ($L_g$) of 0.5 microns, FP length ($L_f$) of the first field plate of 1.1 microns, and a device width (w) of 500 microns. The test showed that devices having a field plate connected to the source electrode exhibit improved maximum stable gain (MSG) and reduced reverse transmission (S12).

Figure 11:
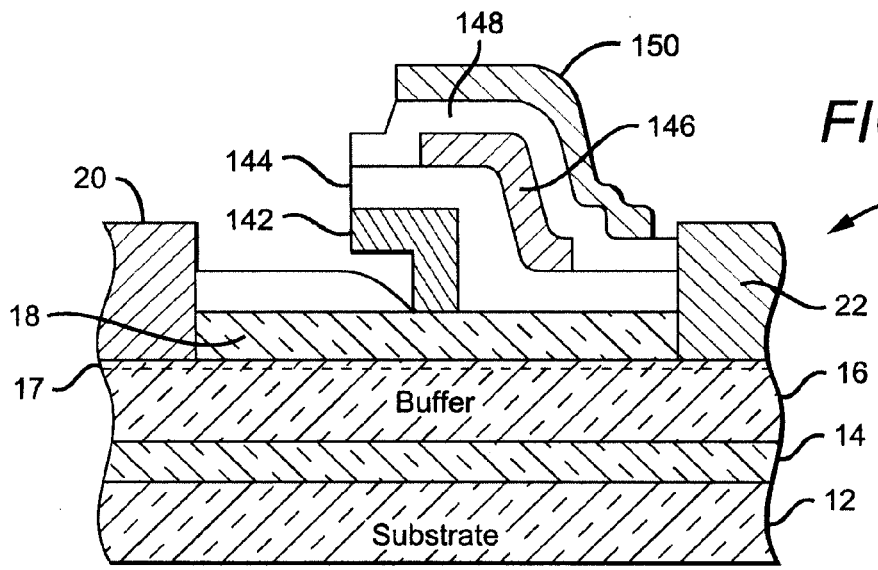
FIG. 11 is a sectional view of another embodiment of a HEMT according to the present invention having a gamma gate.

The source connected field plate arrangement according to the present invention can be used in many different HEMTs beyond those described above. For example, FIG. 11 shows another embodiment of a HEMT 140 according to the present invention that has many features similar to those in HEMTs 10, 50, 60 described above, including a substrate 12, nucleation layer 14, buffer layer 16, 2DEG 17, barrier layer 18, source electrode 20, and drain electrode 22. HEMT 140, however, has a gamma (Γ) shaped gate 142 that is particularly adapted to high frequency operation. The gate length ($L_g$) is one of the important device dimensions in determining the speed of the device, and with higher frequency devices the gate length is shorter. Shorter gate length can lead to high resistance that can negatively impact high frequency operation. T-gates are commonly used in high frequency operation, but it can be difficult to achieve a well-coupled placement of a field plate with a T-gate.

The gamma gate 142 provides for low gate resistance and allows for controlled definition of the gate footprint. A spacer layer 144 is included that covers the gamma gate 142 and the surface of barrier layer 18 between the gamma gate 142 and the source and drain electrodes 20, 22, although the spacer layer 144 can cover less as described above. A space can remain between the horizontal portion of the gamma gate 82 and the top of the spacer layer 144. The HEMT 140 also includes a first field plate 146 on the spacer layer 144 that overlaps that gamma gate 142. The first field plate 146 is preferably deposited on the side of the gamma gate 142 not having a horizontal overhanging section. This arrangement allows for tight placement and effective coupling between the field plate 146 and the active layers below it. In other gamma gate embodiments the field plate can be similarly arranged to field plate 86, but instead of overlapping the gate, there can be a space between the edge of the gate and the field plate similar to space $L_{gf}$ shown in FIG. 2 and described above.

The field plate 146 can be electrically connected to the gate 142 or the source electrode 20 in many different ways as described above. In the case where it is connected to the source electrode 20, the space between the lower surface of the horizontal section of the gate 142 and the spacer layer 144 can present difficulties in providing a conductive path directly between the field plate 146 and the source electrode 20. Instead, one or more conductive paths can be included between the field plate 146 and the source electrode 20 that run outside the active area of the HEMT 140. Alternatively, the gamma gate 142 can be completely covered by the spacer layer 144 with the space under the gate's horizontal section filled. Conductive paths can then run directly from the field plate 146 to the source electrode over the spacer layer 144. The field plate 146 can alternatively be connected to the gate using vias or conductive paths as described above.

The HEMT 140 also comprises a second spacer layer 148 and a second field plate 150 formed on it and connected to the source electrode 20. As with the first field plate 146, the space between the lower surface of the horizontal section of the gate 142 and the spacer layer 144 can present difficulties in providing a conductive path directly between the field plate 146 and the source electrode 20. One or more conductive paths can be included that run outside the active area of the HEMT 140. Alternatively, the gamma gate 142 can be completely covered by the first or second spacer layers 144, 148 with the space under the gate's horizontal section filled. Conductive paths can then run directly from the field plate 146 to the source electrode over the spacer layer 144. The active structure can then be covered by a dielectric passivation layer (not shown).

Figure 12:
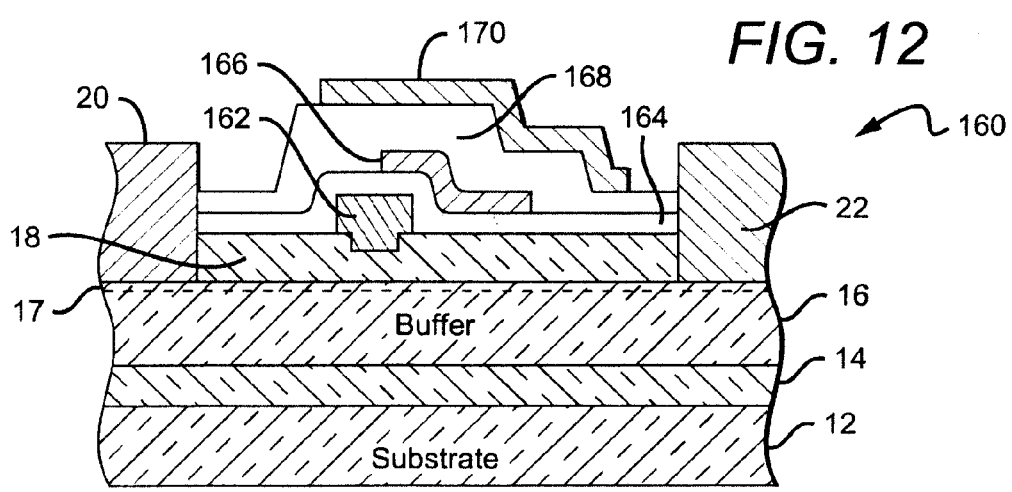
FIG. 12 is a sectional view of another embodiment of a HEMT according to the present invention having a recessed gate.

FIG. 12 shows still another HEMT 160 according to the present invention that can also be arranged with multiple field plates as shown and described above. HEMT 160 also comprises a substrate 12, nucleation layer 14, buffer layer 16, 2DEG 17, barrier layer 18, source electrode 20, and drain electrode 22. The gate 162, however, is recessed in the barrier layer 18, and is covered by a spacer layer 164. A field plate 166 is arranged on the spacer layer 164 and is either connected to the source electrode 20 or gate 162. A second spacer layer 168 is included on over the first field plate 166 and first spacer layer 164, with a second field plate 170 included on the second spacer layer 168 and electrically connected to the source electrode 20. The top surface can then be covered by a passivation layer (not shown). As shown, the bottom portion of the gate 162 is only partially recessed and in other embodiments the bottom surface of the gate can be fully recessed or different portions of the gate can be recessed to different depths in the barrier layer 18.

The gamma and recessed gate arrangement described above in FIGS. 11 and 12 can be used with different transistors such as MESFETs and each can comprise more than two spacer layers and field plates. The top field plate should be connected to the source electrode while the intermediate field plates below can be connected to the source electrode or the gate. For example, a transistor according to the present invention can have three field plates, with the top one connected to the source electrode and the ones below connected to either the source electrode or the gate.

The embodiments above provide wide bandgap transistors with improved power at microwave and millimeter wave frequencies. The transistors exhibit simultaneous high gain, high power, and more stable operation due to higher input-output isolation. The structure could be extended to larger dimensions for high voltage applications at lower frequencies.

Although the present invention has been described in considerable detail with reference to certain preferred configurations thereof, other versions are possible. The field plate arrangement can be used in many different devices. The field plates can also have many different shapes and can be connected to the source contact in many different ways. For example, the field plate can extend from over the HEMT's active area such that the connection is continuous between the field plate and source contact, instead of through buses or conductive paths. This arrangement can, however, introduce prohibitive capacitance into the structure. Accordingly, the spirit and scope of the invention should not be limited to the preferred versions of the invention described above.

We claim:

1. A transistor, comprising:
a plurality of semiconductor layers;
source and drain electrodes on said semiconductor layers;
a gate between said source and drain electrodes, said gate directly on said semiconductor layers;
at least two spacer layers, wherein a first spacer layer at least partially on said gate and at least part of a surface of said active region between said gate and drain;
at least two field plates, a first field plate contacting and extending a distance $L_f$ from an edge of said gate toward said drain, and the remaining of said spacer layers and field plates arranged alternately over said first spacer layer and said first field plate, wherein an outermost field plate at least partially overlaps said first field plate and is electrically connected to said source electrode, wherein at least one of said field plates other than said outermost field plate is electrically connected to said gate.

2. The transistor of claim 1, wherein said first field plate at least partially overlaps said gate.

3. The transistor of claim 1, wherein said first field plate is on said gate and integral with said gate.

4. The transistor of claim 1, wherein each of said field plates above said first field plate is separated from the field plate below by one of said spacer layers.

5. The transistor of claim 1, wherein each of said field plates is connected to said source electrode or gate by at least one electrically connecting conductive path.

6. The transistor of claim 1, wherein said outermost field plate extends toward said drain on only one side of said gate.

7. The transistor of claim 1, said gate is gamma shaped.

8. The transistor of claim 1, said gate at least partially recessed into said active region.

9. The transistor of claim 1, wherein said field plates reduce the peak operating electric field in said transistor compared to the same transistor without said field plates.

10. The transistor of claim 9, wherein said reduction in peak operating electric field increases the breakdown voltage of said transistor.

11. The transistor of claim 9, wherein said reduction in peak operating electric field reduces trapping in said transistor.

12. The transistor of claim 9, wherein said reduction in peak operating electric field reduces leakage currents in said transistor.

13. The transistor of claim 1, wherein said spacer layers comprise a dielectric material.

14. The transistor of claim 1, wherein at least one of said spacer layers comprises an epitaxial material.

15. The transistor of claim 1, wherein said first of said spacer layers comprises an epitaxial material.

16. A transistor, comprising:
a plurality of semiconductor layers;
source and drain on said semiconductor layers;
a gate between said source and drain, said gate directly on and at least partially recessed in said semiconductor layers;
a plurality of spacer layers, wherein a first spacer layer on at least part of the surface of said semiconductor layers between said gate and said drain or on at least part of the surface of said semiconductor layers between said gate and said source; and
a plurality of field plates, wherein a first field plate extends towards said drain and is electrically connected to said gate, wherein an outermost field plate at least partially overlaps said first field plate and is electrically connected to said source electrode.

17. The transistor of claim 16, wherein the other of said plurality of field plates and the other of said plurality of spacer layers are disposed above said first field plate in an alternating manner, wherein each of said plurality of field plates are electrically isolated from other field plates by one of said plurality of spacer layers.

18. The transistor of claim 16, wherein each of said field plates is connected to said source or said gate by at least one electrically connecting conductive path.

19. The transistor of claim 16, wherein said outermost field plate extends toward said drain on only one side of said gate.

20. The transistor of claim 16, further comprising a substrate wherein said semiconductor layers are on said substrate.

21. The transistor of claim 16, covered by a passivation layer.

22. The transistor of claim 16, wherein said field plate is on said gate and integral with said gate.

23. The transistor of claim 16, wherein said field plate reduces the peak operating electric field in said transistor.

24. A transistor, comprising:
a Group-III nitride active region;
source and drain electrodes;
a gate between said source and drain electrodes and on said active region, said gate in direct contact with said active region along the entire length of said gate; and
a plurality of field plates and a plurality of spacer layers arranged and alternating over said active region, a first of said spacer layers on the surface of said active region between said gate and said source and drain electrodes, a first of said field plates isolated from said active region by said first of said spacer layers and the others of said field plates isolated from said field plates below by a respective one of the remaining said spacer layers, an outermost of said field plates electrically connected to said source electrode and each of the others of said field plates electrically connected to said gate or said source electrode, wherein said outermost field plate extends over said first field plate and on either side of said gate toward said source and said drain.

25. The transistor of claim 24, wherein at least a portion of each of said spacer layers is sandwiched between a respective one of said field plates and the surface below said one of said spacer layers.

26. The transistor of claim 24, wherein said first one of said spacer layers is between said first one of said field plates and the surface of said active region, the others of said spacer layers alternating in a stack on first of said spacer layers and field plates.

27. The transistor of claim 24, wherein each of said field plates is electrically connected to said source electrode or gate by at least one electrically connecting conductive path.

28. The transistor of claim 24, wherein said first one of said spacer layers at least partially covers said gate and at least part of the surface of said active region between said gate and drain electrode, and said first one of said field plates at least partially overlapping said gate and extending on said first one of said spacer layers a distance Lf from an edge of said gate toward said drain electrode.

29. The transistor of claim 24, further comprising at least one conductive path wherein at least one of said field plates is electrically connected to said source electrode by said at least one conductive path, each said path running outside of said spacer layers.

30. The transistor of claim 24, further comprising at least one conductive path, wherein one of said spacer layers covers said gate and the surface of said active region between said gate and source electrode, at least one of said field plates electrically connected to said source electrode by said least one conductive path, said path running over said one of said spacer layers.

31. The transistor of claim 24, comprising a high electron mobility transistor (HEMT).

32. The transistor of claim 24, comprising a field effect transistor.

33. The transistor of claim 24, wherein said gate is gamma shaped.

34. The transistor of claim 24, wherein said gate is at least partially recessed in said active region.

35. The transistor of claim 24, wherein said field plates reduce the peak operating electric field in said transistor compared to the same transistor without said field plates.

36. The transistor of claim 24, wherein said first field plate is on said gate and integral with said gate.

37. A transistor, comprising:
a Group-III nitride active region;
source and drain electrodes in contact with said active region;
a gate between said source and drain electrodes, said gate directly contacting said active region along the entire length of said gate;
at least two spacer layers; and
at least two field plates, a first spacer layer on substantially all of the surface of said active region between said gate and said drain and source electrodes, a first field plate on said first spacer layer, and the remaining of said spacer layers and field plates arranged alternately over said first of said spacer layers and said first of said field plates, the outermost of said field plates electrically connected to said source electrode and each of said field plates below said outermost of said field plates electrically connected to said gate or source electrode, wherein said outermost field plate extends over said first field plate and past the edges of said gate toward said source and said drain.

38. A transistor, comprising:
an active region having a silicon carbide channel;
source and drain electrodes in contact with said active region;
a gate between said source and drain electrodes and directly on said active region along the entire span of said gate;
a plurality of spacer layers;
a plurality of field plates, the first of said field plates contacting and extending from said gate on the first of said spacer layers, and the remaining of said spacer layers and field plates arranged alternately over said first of said spacer layers and said first of said field plates, the topmost of said field plates electrically connected to said source electrode and each of said field plates below said topmost of said field plates electrically connected to said gate or source electrode, said first of said spacer layers on the surface of said active region between said gate and said source and drain electrodes.

* * * * *